US012796373B2

(12) United States Patent
Honda

(10) Patent No.: US 12,796,373 B2
(45) Date of Patent: Nov. 10, 2026

(54) SUBSTRATE PROCESSING APPARATUS AND SUBSTRATE PROCESSING METHOD

(71) Applicant: Tokyo Electron Limited, Tokyo (JP)

(72) Inventor: Takumi Honda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 180 days.

(21) Appl. No.: 18/861,885

(22) PCT Filed: Jun. 19, 2023

(86) PCT No.: PCT/JP2023/022525
§ 371 (c)(1),
(2) Date: Oct. 31, 2024

(87) PCT Pub. No.: WO2024/004725
PCT Pub. Date: Jan. 4, 2024

(65) Prior Publication Data

US 2026/0198248 A1 Jul. 9, 2026

(30) Foreign Application Priority Data

Jul. 1, 2022 (JP) ................................ 2022-106853

(51) Int. Cl.
*H10P 72/00* (2026.01)
*H10P 50/68* (2026.01)
*H10P 70/00* (2026.01)

(52) U.S. Cl.
CPC ........ *H10P 72/0426* (2026.01); *H10P 50/683* (2026.01); *H10P 70/15* (2026.01); *H10P 72/0416* (2026.01); *H10P 72/0602* (2026.01); *H10P 72/0604* (2026.01)

(58) Field of Classification Search
None
See application file for complete search history.

(56) References Cited

FOREIGN PATENT DOCUMENTS

JP 2004-214243 A 7/2004

OTHER PUBLICATIONS

International Search Report and Written Opinion mailed on Aug. 29, 2023, received for PCT Application PCT/JP2023/022525, filed on Jun. 19, 2023, 08 pages including English Translation.

*Primary Examiner* — Binh X Tran
(74) *Attorney, Agent, or Firm* — XSENSUS LLP

(57) ABSTRACT

A substrate processing apparatus includes a rinsing tank, a processing tank, an acquisition unit, a concentration adjusting unit, and a concentration controlling unit. The rinsing tank retains rinse liquid including water, and in which substrates including inorganic films are dipped to execute a rinsing process. The processing tank retains phosphoric acid processing liquid, and in which the rinsing-processed substrates are dipped to execute an etching process. The acquisition unit acquires the number of the substrates to be collectively dipped in the processing tank. The concentration adjusting unit adjusts a concentration of the phosphoric acid processing liquid. The concentration controlling unit is configured to: based on the number, acquire a brought-in amount that is an amount of the rinse liquid brought in the processing tank along with the substrates; and control the concentration adjusting unit based on the brought-in amount to adjust a concentration of the phosphoric acid processing liquid.

15 Claims, 7 Drawing Sheets

SUBSTRATE PROCESSING APPARATUS AND SUBSTRATE PROCESSING METHOD

CROSS-REFERENCE TO RELATED APPLICATIONS

This application is national stage application of International Application No. PCT/JP2023/022525, filed on Jun. 19, 2023, which designates the United States, incorporated herein by reference, and which claims the benefit of priority from Japanese Patent Application No. 2022-106853, filed on Jul. 1, 2022, the entire contents of each are incorporated herein by reference.

FIELD

Exemplary embodiment disclosed herein relates to a substrate processing apparatus and a substrate processing method.

BACKGROUND

Conventionally, there has been known a technology for dipping a plurality of substrates in an etching tank retaining etchant so as to collectively perform etching on the plurality of substrates.

CITATION LIST

Patent Literature

Japanese Patent Application Laid-open No. 2004-214243 discloses an etching method of semiconductor wafers in which the temperature of etchant is preliminarily set to be rather high in consideration of a reduction amount in temperature due to an input of the semiconductor wafers.

Solution to Problem

A substrate processing apparatus according to one aspect of the embodiment includes a rinsing tank, a processing tank, an acquisition unit, a concentration adjusting unit, and a concentration controlling unit. The rinsing tank is a tank retaining therein rinse liquid including water, and in which a plurality of substrates each including inorganic films is dipped in the retained rinse liquid to execute a rinsing process on the plurality of substrates. The processing tank is a tank retaining therein phosphoric acid processing liquid, and in which the plurality of substrates subsequent to the rinsing process is dipped in the retained phosphoric acid processing liquid to execute an etching process on the plurality of substrates. The acquisition unit acquires a number of the substrates to be collectively dipped in the processing tank. The concentration adjusting unit adjusts a concentration of the phosphoric acid processing liquid retained in the processing tank. The concentration controlling unit is configured to: based on the number of the substrates acquired by the acquisition unit, acquire a brought-in amount that is an amount of the rinse liquid brought in the processing tank along with the plurality of substrates; and control the concentration adjusting unit based on the brought-in amount to adjust a concentration of the phosphoric acid processing liquid.

DESCRIPTION OF EMBODIMENTS

Figure 1:
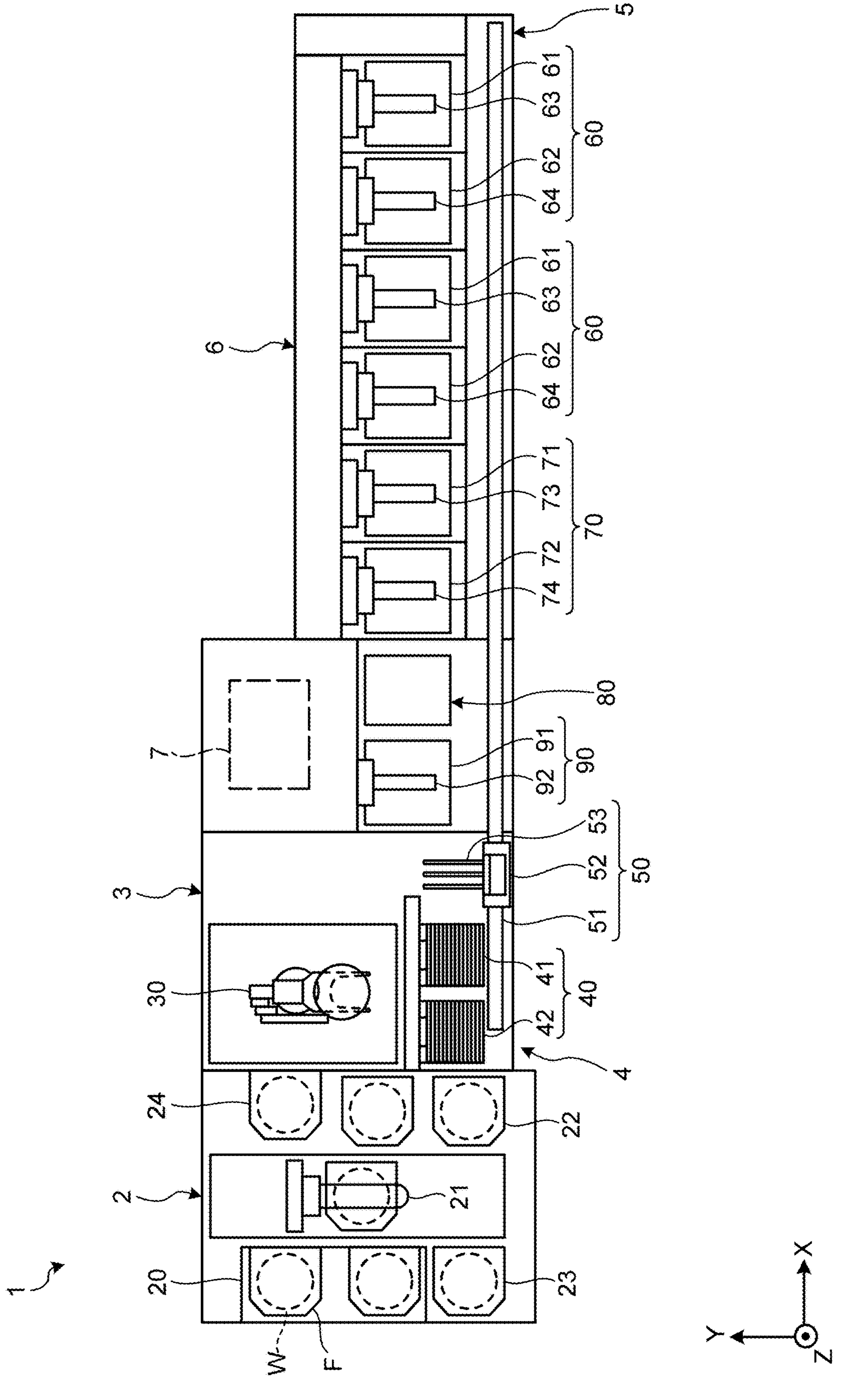
FIG. 1 is a schematic block diagram illustrating a configuration of a substrate processing system according to an embodiment.

Hereinafter, modes (hereinafter, may be referred to as "embodiments") for carrying out a substrate processing apparatus and a substrate processing method according to the present disclosure will be described in detail with reference to accompanying drawings. In addition, the present disclosure is not limited to the embodiments described below. Moreover, any of these embodiments may be appropriately combined within a consistent range. In the following explanation, parts similar to those having been already explained are provided with the same reference symbols as those of the already-explained parts, and duplicated explanation is appropriately omitted.

Furthermore, expressions of "constant", "perpendicular", "vertical", and "parallel" used in the following embodiments are not necessarily identical to "constant", "perpendicular", "vertical", and "parallel" strictly. In other words, the above-mentioned expressions may include a divergence caused by, for example, manufacturing accuracy, installation accuracy, and the like.

In the drawings referred herein, an X-axis direction, a Y-axis direction, and a Z-axis direction that are perpendicular to each other are defined, and a rectangular coordinate system having a Z-axis positive direction as the upward vertical direction may be indicated for better understandings. Additionally, a rotational direction around a vertical axis may be referred to as a θ-direction.

There has been proposed a technology for dipping a substrate, which is obtained by alternately laminating a silicon nitride film and a silicon oxide film, in phosphoric acid processing liquid so as to selectively perform etching on the silicon nitride film from among the silicon nitride film and the silicon oxide film.

Herein, in a case where a rinsing-processed substrate is input into a processing tank, rinse liquid adhering to the substrate is brought in the processing tank, and thus there presents possibility that the concentration of phosphoric acid processing liquid becomes lower than a desired one.

An amount of rinse liquid that is brought in a processing tank fluctuates depending on the number of substrates that are collectively dipped in the processing tank. Specifically, an amount of rinse liquid that is brought in a processing tank is larger as the number of substrates that are collectively dipped in the processing tank is larger. In a case where an amount of rinse liquid that is brought in a processing tank fluctuates, a degree of a reduction in concentration of phosphoric acid processing liquid in the processing tank accordingly fluctuates. Thus, for example, there presents possibility that a variation in an etching amount due to concentration difference of phosphoric acid processing liquid occurs between a case where an etching process is collectively performed on 25 substrates and a case where an etching process is collectively performed on 50 substrates.

Recently, in accordance with high lamination of films, unevenness in an etching rate between the top and the bottom due to difference in Si concentration in a lamination direction becomes noticeable, and in response thereto, there has been proposed cycle etching for repeatedly performing a rinsing process and an etching process at short time intervals. However, an effect caused by a reduction in concentration of phosphoric acid processing liquid due to brought-in rinse liquid is larger as a necessary time interval of a single etching process is shorter. In consideration thereof, in a technology for collectively performing etching on a plurality of substrates by using phosphoric acid aqueous solution, there has been desired a technology that is capable of reducing a variation in an etching amount.

<Configuration of Substrate Processing System>

A configuration of a substrate processing system 1 according to an embodiment will be explained with reference to FIG. 1. FIG. 1 is a schematic block diagram illustrating a configuration of the substrate processing system 1 according to the embodiment. The substrate processing system 1 is one example of a substrate processing apparatus.

As illustrated in FIG. 1, the substrate processing system 1 according to the embodiment includes a carrier carrying-in/out section 2, a lot forming section 3, a lot placing section 4, a lot transfer section 5, a lot processing section 6, and a control device 7.

The carrier carrying-in/out section 2 includes a carrier stage 20, a carrier transfer mechanism 21, carrier stocks 22 and 23, and a carrier placing pedestal 24.

A plurality of Front Opening Unified Pods (FOUPs) F is placed on the carrier stage 20, which is transferred from the outside. Each of the FOUPs F is a container that is capable of accommodating therein a plurality of wafers W (for example, 25 wafers) vertically aligned in a horizontal posture. The carrier transfer mechanism 21 transfers the FOUP F between the carrier stage 20, the carrier stocks 22 and 23, and the carrier placing pedestal 24.

From the FOUP F that is placed on the carrier placing pedestal 24, the plurality of wafers W to be processed is carried out to the lot processing section 6 by a substrate transferring mechanism 30 to be mentioned later. To the FOUP F that is placed on the carrier placing pedestal 24, the plurality of processed wafers W is carried in from the lot processing section 6 by the substrate transferring mechanism 30.

The lot forming section 3 includes the substrate transferring mechanism 30 so as to form a lot. A lot is constituted of the plurality of wafers W that is obtained by combining the wafers W to be simultaneously processed, which are housed in at least one of the FOUPs F. The plurality of wafers W forming a single lot is aligned at constant intervals in a state where principal surfaces thereof are facing to each other. For example, the lot forming section 3 may form a single lot by using the 25 wafers W that are housed in the single FOUP F, or may form a single lot by using a total of the 50 wafers W that are housed in the double FOUPs F.

The substrate transferring mechanism 30 transfers the plurality of wafers W between the FOUP F placed on the carrier placing pedestal 24 and the lot placing section 4.

The lot placing section 4 includes a lot transferring pedestal 40, and a lot transferred between the lot forming section 3 and the lot processing section 6 by the lot transfer section 5 is temporarily placed (waits) thereon. The lot transferring pedestal 40 includes a carry-in side placing pedestal 41 on which a lot to be processed formed by the lot forming section 3 is placed and a carry-out side placing pedestal 42 on which a lot having been processed in the lot processing section 6 is placed. The plurality of wafers W having an amount of one lot is aligned one behind the other in an erected posture on each of the carry-in side placing pedestal 41 and the carry-out side placing pedestal 42.

The lot transfer section 5 includes a lot transferring mechanism 50 so as to transfer a lot between the lot placing section 4 and the lot processing section 6, and/or in the lot processing section 6. The lot transferring mechanism 50 includes a rail 51, a moving body 52, and a substrate holding body 53.

The rail 51 is arranged along an X-axis direction over the lot placing section 4 and the lot processing section 6. The moving body 52 is configured to be capable of moving along the rail 51 while holding the plurality of wafers W. The substrate holding body 53 is provided to the moving body 52 so as to hold the plurality of wafers W that is aligned one behind the other in an erected posture.

The lot processing section 6 collectively performs an etching process, a cleaning process, a drying process, and the like on the plurality of wafers W having an amount of one lot. In the lot processing section 6, two etching processing devices 60, a cleaning processing device 70, a cleaning processing device 80, and a drying processing device 90 are arranged side-by-side along the rail 51.

Each of the etching processing devices 60 collectively executes an etching process on the plurality of wafers W having an amount of one lot. The cleaning processing device 70 collectively executes a cleaning process on the plurality of wafers W having an amount of one lot. The cleaning processing device 80 executes a cleaning process on the substrate holding body 53. The drying processing device 90 collectively executes a drying process on the plurality of wafers W having an amount of one lot. Note that the numbers of the etching processing devices 60, the cleaning processing devices 70, the cleaning processing devices 80, and the drying processing devices 90 are not limited to the examples illustrated in FIG. 1.

Each of The etching processing devices 60 includes a processing tank 61 dedicated to an etching process, a processing tank 62 dedicated to a rinsing process, and substrate lifting/lowering mechanisms 63 and 64.

The processing tank 61 is capable of housing therein the wafers W having an amount of one lot which are aligned in an erected posture, so as to retain chemical liquid dedicated to an etching process, specifically, phosphoric acid processing liquid. Details of the processing tank 61 will be mentioned later.

The processing tank 62 retains rinse liquid. The rinse liquid includes water. For example, the rinse liquid is deionized water. In each of the substrate lifting/lowering mechanisms 63 and 64, the plurality of wafers W forming a lot is held in a state where the wafers W are aligned one behind the other in an erected posture.

Each of the etching processing devices 60 causes the corresponding substrate lifting/lowering mechanism 63 to hold a lot that is transferred by the lot transfer section 5, and further dips the lot in phosphoric acid processing liquid of the processing tank 61 so as to execute an etching process.

A lot that is etching-processed in the processing tank 61 is transferred to the processing tank 62 by the lot transfer section 5. The etching processing device 60 causes the substrate lifting/lowering mechanism 64 to hold the transferred lot, and further dips the lot in rinse liquid of the processing tank 62 so as to execute a rinsing process. The lot that is rinsing-processed in the processing tank 62 is transferred to a processing tank 71 of the cleaning processing device 70 by the lot transfer section 5.

The cleaning processing device 70 includes the processing tank 71 dedicated to cleaning, a processing tank 72 dedicated to a rinsing process, and substrate lifting/lowering mechanisms 73 and 74. Chemical liquid (hereinafter, may be referred to as "cleaning solution") dedicated to cleaning is retained in the processing tank 71 dedicated to cleaning. The cleaning solution may be SC-1 (mixed solution of ammonia, hydrogen peroxide, and water) or the like, for example.

Processing liquid (e.g. deionized water) dedicated to a rinsing process is retained in the processing tank 72 dedicated to a rinsing process. Each of the substrate lifting/lowering mechanisms 73 and 74 holds the plurality of wafers W having an amount of one lot in a state where the wafers W are aligned one behind the other in an erected posture.

The cleaning processing device 70 causes the substrate lifting/lowering mechanism 73 to hold a lot transferred by the lot transfer section 5, and further dips the lot in cleaning liquid of the processing tank 71 so as to execute a cleaning process.

A lot that is cleaning-processed in the processing tank 71 is transferred to the processing tank 72 by the lot transfer section 5. The cleaning processing device 70 causes the substrate lifting/lowering mechanism 74 to hold the transferred lot, and further dips the lot in rinse liquid of the processing tank 72 so as to execute a rinsing process. The lot that is rinsing-processed in the processing tank 72 is transferred to a processing tank 91 of the drying processing device 90 by the lot transfer section 5.

The drying processing device 90 includes the processing tank 91 and a substrate lifting/lowering mechanism 92. Process gas dedicated to a drying process is supplied to the processing tank 91. In the substrate lifting/lowering mechanism 92, the plurality of wafers W having an amount of one lot is held in a state where the wafers W are aligned one behind the other in an erected posture.

The drying processing device 90 causes the substrate lifting/lowering mechanism 92 to hold a lot transferred by the lot transfer section 5 so as to execute a drying process thereon by using process gas dedicated to a drying process, which is supplied into the processing tank 91. The lot that is drying-processed in the processing tank 91 is transferred to the lot placing section 4 by the lot transfer section 5.

The cleaning processing device 80 supplies processing liquid dedicated to cleaning to the substrate holding body 53 of the lot transferring mechanism 50, and further supplies thereto drying gas so as to execute a cleaning process on the substrate holding body 53.

A control device 7 controls operations of units (carrier carrying-in/out section 2, lot forming section 3, lot placing section 4, lot transfer section 5, lot processing section 6, etc.) of the substrate processing system 1. The control device 7 controls operations of the units of the substrate processing system 1 on the basis of signals transmitted from switches, various sensors, and the like.

The control device 7 includes a micro-computer including a Central Processing Unit (CPU), a Read Only Memory (ROM), a Random Access Memory (RAM), an input/output port, and the like; and various circuits. For example, the control device 7 reads and executes a program that is stored in a storage 9 (see FIG. 3) so as to control operations of the substrate processing system 1. Details of the above-mentioned control device 7 will be mentioned later.

<Configuration of Etching Processing Device>

Figure 2:
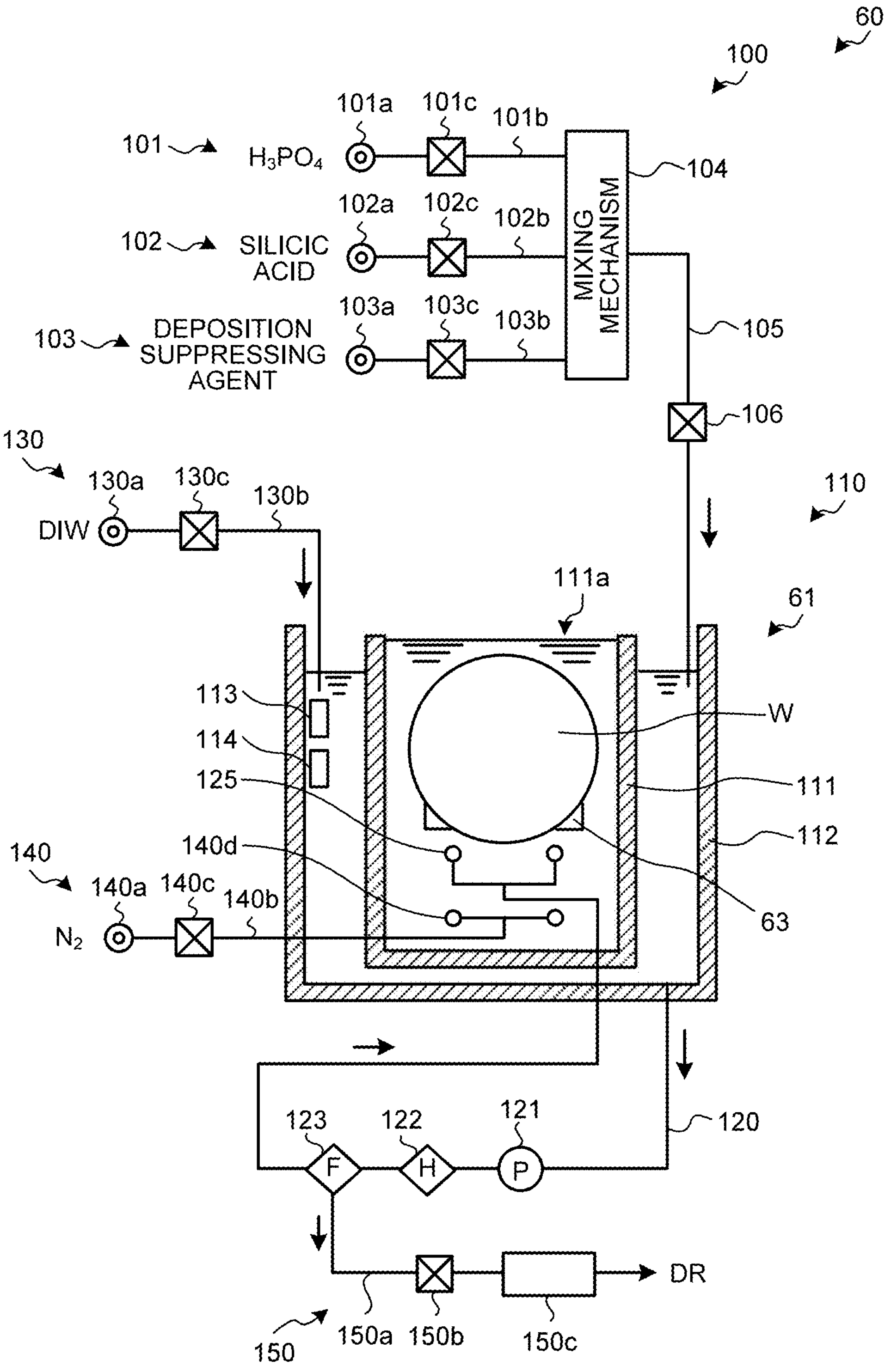
FIG. 2 is a schematic block diagram illustrating a configuration of an etching processing device according to the embodiment.

Next, a configuration of the etching processing device 60 that implements an etching process of the wafer W will be explained with reference to FIG. 2. FIG. 2 is a schematic block diagram illustrating a configuration of the etching processing device 60 according to the embodiment.

The etching processing device 60 includes a phosphoric acid processing liquid supply unit 100 and a substrate processing unit 110. The phosphoric acid processing liquid supply unit 100 generates phosphoric acid processing liquid so as to supply the generated phosphoric acid processing liquid to the substrate processing unit 110.

The phosphoric acid processing-liquid supply unit 100 includes a phosphoric acid aqueous solution supply unit 101, a silicic acid solution supply unit 102, a deposition suppressing agent supply unit 103, a mixing mechanism 104, a phosphoric acid processing liquid supply route 105, and a flow controller 106.

The phosphoric acid aqueous solution supply unit 101 supplies phosphoric acid aqueous solution to the mixing mechanism 104. The above-mentioned phosphoric acid aqueous solution supply unit 101 includes a phosphoric acid aqueous solution supply source 101*a*, a phosphoric acid aqueous solution supply route 101*b*, and a flow controller 101*c*.

The phosphoric acid aqueous solution supply source 101*a* is a tank that retains phosphoric acid aqueous solution, for example. The phosphoric acid aqueous solution supply route 101*b* connects the phosphoric acid aqueous solution supply source 101*a* and the mixing mechanism 104 to each other so as to supply phosphoric acid aqueous solution from the phosphoric acid aqueous solution supply source 101*a* to the mixing mechanism 104.

The flow controller 101*c* is arranged on the phosphoric acid aqueous solution supply route 101*b* so as to adjust a flow volume of phosphoric acid aqueous solution to be supplied to the mixing mechanism 104. The flow controller 101*c* includes an open/close valve, a flow volume controlling valve, a flowmeter, etc.

The silicic acid solution supply unit 102 supplies, to the mixing mechanism 104, solution (hereinafter, may be referred to as "silicic acid solution") including a silicic acid compound. The above-mentioned silicic acid solution supply unit 102 includes a silicic acid solution supply source 102*a*, a silicic acid solution supply route 102*b*, and a flow controller 102*c*.

The silicic acid solution supply source 102*a* is a tank that retains silicic acid solution, for example. The silicic acid solution supply route 102*b* connects the silicic acid solution supply source 102*a* and the mixing mechanism 104 to each other so as to supply silicic acid solution from the silicic acid solution supply source 102*a* to the mixing mechanism 104.

The flow controller 102*c* is arranged on the silicic acid solution supply route 102*b* so as to adjust a flow volume of silicic acid solution to be supplied to the mixing mechanism 104. The flow controller 102*c* includes an open/close valve, a flow volume controlling valve, a flowmeter, etc. The silicic acid solution according to the embodiment is solution obtained by dispersing colloidal silicon therein, for example.

The deposition suppressing agent supply unit 103 supplies deposition suppressing agent to the mixing mechanism 104. The above-mentioned deposition suppressing agent supply unit 103 includes a deposition suppressing agent supply source 103*a*, a deposition suppressing agent supply route 103*b*, and a flow controller 103*c*.

The deposition suppressing agent supply source 103*a* is a tank that retains deposition suppressing agent, for example. The deposition suppressing agent supply route 103*b* connects the deposition suppressing agent supply source 103*a* and the mixing mechanism 104 to each other so as to supply deposition suppressing agent from the deposition suppressing agent supply source 103*a* to the mixing mechanism 104.

The flow controller 103*c* is arranged on the deposition suppressing agent supply route 103*b* so as to adjust a flow volume of deposition suppressing agent to be supplied to the mixing mechanism 104. The flow controller 103*c* includes an open/close valve, a flow volume controlling valve, a flowmeter, etc.

It is sufficient that the deposition suppressing agent according to the embodiment includes at least a component that suppresses deposition of silicon oxide. The deposition suppressing agent may include a component that stabilizes silicate ion dissolved in phosphoric acid aqueous solution while maintaining a dissolved state thereof so as to prevent deposition of silicon oxide, for example. Moreover, the deposition suppressing agent may include a component that prevents deposition of silicon oxide by another well-known method.

Hexafluorosilicic acid ($H_2SiF_6$) aqueous solution including a fluorine component may be employed for the deposition suppressing agent according to the embodiment, for example. Moreover, the deposition suppressing agent may include an additive such as ammonia in order to stabilize hexafluorosilicic acid in aqueous solution.

Ammonium hexafluorosilicic acid $(NH_4)_2SiF_6$, sodium hexafluorosilicic acid ($Na_2SiF_6$), and the like may be employed for the deposition suppressing agent according to the embodiment, for example.

The deposition suppressing agent according to the embodiment may be a compound including an element whose cation has an ionic radius of 0.2 Å to 0.9 Å. Herein, the "ionic radius" is a radius of an ion, which is empirically calculated based on a sum of radii of an anion and a cation obtained from a lattice constant of a crystal lattice.

For example, the deposition suppressing agent according to the embodiment may include an oxide of an element selected from among aluminum, potassium, lithium, sodium, magnesium, calcium, zirconium, tungsten, titanium, molybdenum, hafnium, nickel, and chromium.

Furthermore, instead of or in addition to an oxide of the above-mentioned selected element, the deposition suppressing agent according to the embodiment may include at least one of nitride, chloride, bromide, hydroxide, and nitrate of the above-mentioned elements.

The deposition suppressing agent according to the embodiment may include at least one of $Al(OH)_3$, $AlCl_3$, $AlBr_3$, $Al(NO_3)_3$, $Al_2(SO_4)_3$, $AlPO_4$, and $Al_2O_3$, for example.

The deposition suppressing agent according to the embodiment may include at least one of KCl, KBr, KOH, and $KNO_3$. Moreover, the deposition suppressing agent according to the embodiment may include at least one of LiCl, NaCl, $MgCl_2$, $CaCl_2$, and $ZrCl_4$.

The mixing mechanism 104 mixes phosphoric acid aqueous solution, silicic acid solution, and the deposition suppressing agent so as to generate phosphoric acid processing liquid. In other words, the phosphoric acid processing liquid according to the embodiment contains phosphoric acid aqueous solution, silicic acid solution, and the deposition suppressing agent.

For one example, the mixing mechanism 104 includes a tank and a circulation path. The circulation path is provided with a pump, a filter, a heater, and the like. The above-mentioned mixing mechanism 104 circulates liquid retained in the tank by using the circulation path to be capable of mixing liquid retained in the tank. Additionally, the mixing mechanism 104 is capable of heating liquid up to a desired temperature by using a heater provided on the circulation path.

The phosphoric acid processing liquid supply route 105 connects the mixing mechanism 104 and an outer tank 112 of the processing tank 61 to each other so as to supply phosphoric acid processing liquid from the mixing mechanism 104 to the outer tank 112.

The flow controller 106 is arranged on the phosphoric acid processing liquid supply route 105 so as to adjust a flow volume of phosphoric acid processing liquid to be supplied to the outer tank 112. The flow controller 106 includes an open/close valve, a flow volume controlling valve, a flowmeter, etc.

The substrate processing unit 110 dips the wafers W in phosphoric acid processing liquid, which is supplied from the phosphoric acid processing-liquid supply unit 100, so as to execute an etching process on the above-mentioned wafers W. The wafers W are, for example, silicon wafers, and are one example of substrates. A silicon nitride film and a silicon oxide film are alternately laminated on a surface of the wafer W. The substrate processing unit 110 selectively performs etching on a silicon nitride film from among a silicon nitride film and a silicon oxide film that are formed on the wafer W. The silicon nitride film is one example of an inorganic film.

The substrate processing unit 110 includes the processing tank 61, the substrate lifting/lowering mechanism 63, a circulation path 120, a DIW supply unit 130, a gas discharging unit 140, and a processing liquid discharging unit 150. The processing tank 61 includes an inner tank 111 and the outer tank 112.

The inner tank 111 is a tank for dipping the wafers W in phosphoric acid processing liquid, and thus accommodates therein phosphoric acid processing liquid dedicated to dipping. An opening 111*a* is formed in an upper portion of the inner tank 111, and phosphoric acid processing liquid is retained such that a level thereof is close to the opening 111*a*.

In the inner tank 111, the plurality of wafers W is dipped in phosphoric acid processing liquid by the substrate lifting/lowering mechanism 63. Thus, an etching process is collectively performed on the plurality of wafers W. The substrate lifting/lowering mechanism 63 is configured to be capable of lifting and lowering, and further holds the plurality of wafers W in a state where the wafers W are aligned one behind the other in an erected posture.

The outer tank 112 is arranged outside of the inner tank 111 such that the outer tank 112 surrounds the inner tank 111, so as to receive phosphoric acid processing liquid flowing out of the opening 111*a* of the inner tank 111. As illustrated in FIG. 2, a liquid level of the outer tank 112 is kept lower than a liquid level of the inner tank 111.

The outer tank 112 is provided with a temperature sensor 113 configured to measure a temperature of phosphoric acid processing liquid, a concentration sensor 114 (one example of measurement unit) configured to measure a phosphoric acid concentration of phosphoric acid processing liquid. A signal generated by each of the sensors 113 and 114 is input to the control device 7 (see FIG. 1).

Each of the inner tank 111 and the outer tank 112 is formed of a material having a high heat resistance and a high chemical resistance, such as quartz. Thus, a controller 10 is capable of executing an etching process on the wafer W with the use of phosphoric acid processing liquid that is held at a high temperature (for example, equal to or more than 150° C.), so that it is possible to efficiently perform an etching process on the wafers W.

The outer tank 112 and the inner tank 111 are connected to each other by the circulation path 120. One end of the circulation path 120 is connected to a bottom portion of the outer tank 112, and the other end of the circulation path 120 is connected to a processing liquid supply nozzle 125 located in the inner tank 111.

On the circulation path 120, a pump 121, a heater 122 (one example of temperature regulating unit), and a filter 123 are arranged in this order from a side of the outer tank 112.

The pump 121 forms circulating flow of phosphoric acid processing liquid that is delivered from the outer tank 112 to the inner tank 111 via the circulation path 120. The phosphoric acid processing liquid overflows out of the opening 111*a* of the inner tank 111 so as to flow into the outer tank 112 again. In this way, circulating flow of phosphoric acid processing liquid is formed in the substrate processing unit 110. In other words, the above-mentioned circulating flow is formed in the outer tank 112, the circulation path 120, and the inner tank 111.

The heater 122 adjusts a temperature of phosphoric acid processing liquid that is circulating through the circulation path 120. The filter 123 filters phosphoric acid processing liquid that is circulating through the circulation path 120.

The DIW supply unit 130 includes a DIW supply source 130*a*, a DIW supply route 130*b*, and a flow controller 130*c*. The DIW supply unit 130 supplies DeIonized Water (DIW) to the outer tank 112 so as to adjust a concentration of phosphoric acid processing liquid that is retained in the processing tank 61.

The DIW supply route 130*b* connects the DIW supply source 130*a* and the outer tank 112 to each other, so as to supply DIW having a predetermined temperature from the DIW supply source 130*a* to the outer tank 112.

The flow controller 130*c* is arranged on the DIW supply route 130*b* so as to adjust a supply amount of DIW to be supplied to the outer tank 112. The flow controller 130*c* includes an open/close valve, a flow volume controlling valve, a flowmeter, etc. In a case where the flow controller 130*c* adjusts a supply amount of DIW; a temperature of phosphoric acid processing liquid, a phosphoric acid concentration, a silicic acid concentration, and a concentration of deposition suppressing agent in the etching processing devices 60 are adjusted.

The gas discharging unit 140 discharges bubbles of inert gas (for example, nitrogen gas) into phosphoric acid processing liquid that is retained in the inner tank 111. The gas discharging unit 140 includes an inert gas supply source 140*a*, an inert gas supply route 140*b*, a flow controller 140*c*, and a gas nozzle 140*d*.

The inert gas supply route 140*b* connects the inert gas supply source 140*a* and the gas nozzle 140*d* to each other so as to supply inert gas (for example, nitrogen gas) from the inert gas supply source 140*a* to the gas nozzle 140*d*.

The flow controller 140*c* is arranged on the inert gas supply route 140*b* so as to adjust a supply amount of the inert gas to be supplied to the gas nozzle 140*d*. The flow controller 140*c* includes an open/close valve, a flow volume controlling valve, a flowmeter, etc.

The gas nozzle 140*d* is positioned below the wafers W and the processing liquid supply nozzle 125 in the inner tank 111, for example. The gas nozzle 140*d* discharges bubbles of inert gas to phosphoric acid processing liquid retained in the inner tank 111.

Each of the etching processing devices 60 according to the embodiment discharges bubbles of inert gas from the gas nozzle 140*d* to be capable of supplying fast flow of phosphoric acid processing liquid between the plurality of wafers W aligned one behind the other in the inner tank 111. Thus, according to the embodiment, it is possible to efficiently and evenly perform an etching process on the plurality of wafers W.

The etching processing device 60 discharges bubbles of inert gas from the gas nozzle 140*d* to be capable of facilitating evaporation of water that is included in phosphoric acid processing liquid retained in the inner tank 111. The etching processing devices 60 increases a discharge flow volume of inert gas so as to increase an evaporation rate of the water. The etching processing device 60 reduces a discharge flow volume of inert gas so as to reduce an evaporation rate of the water. As described below, the gas discharging unit 140 functions also as a concentration adjusting unit that adjusts a concentration of phosphoric acid processing liquid retained in the inner tank 111.

For example, in a case where replacing a part or whole of phosphoric acid processing liquid used in an etching process, the processing liquid discharging unit 150 discharges the phosphoric acid processing liquid to a drain DR. The processing liquid discharging unit 150 includes a discharge path 150*a*, a flow controller 150*b*, and a cooling tank 150*c*.

The discharge path 150*a* is connected to the circulation path 120. The flow controller 150*b* is arranged on the discharge path 150*a* so as to adjust a discharging amount of phosphoric acid processing liquid to be discharged. The flow controller 150*b* includes an open/close valve, a flow volume controlling valve, a flowmeter, etc.

The cooling tank 150*c* temporarily retains and cools phosphoric acid processing liquid flowing through the discharge path 150*a*. In the cooling tank 150*c*, a discharging amount of phosphoric acid processing liquid is adjusted by the flow controller 150*b*.

Figure 3:
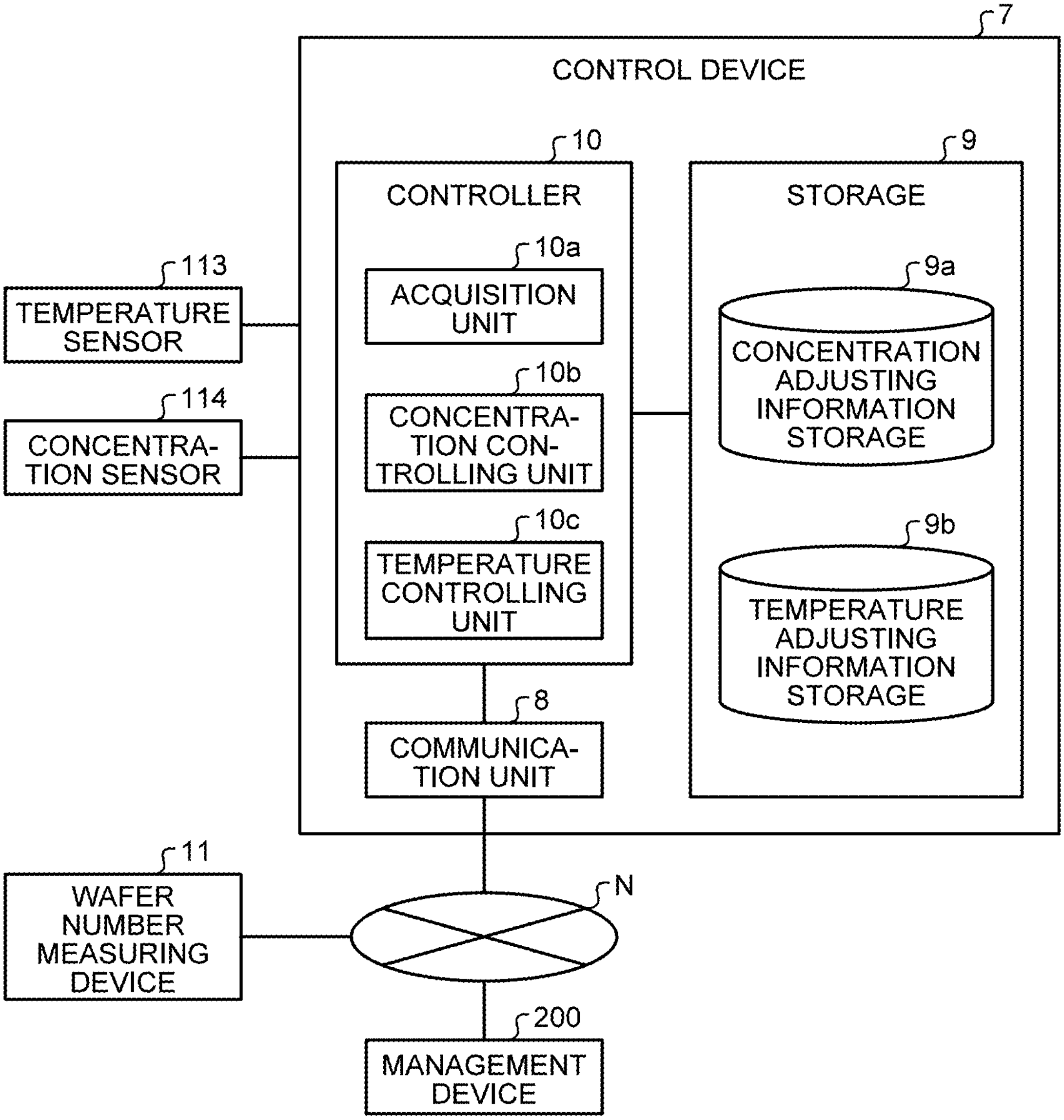
FIG. 3 is a block diagram illustrating a configuration of a control device according to the embodiment.

Next, details of an etching process according to the embodiment will be explained with reference to FIG. 3 to FIG. 5. FIG. 3 is a block diagram illustrating a configuration of the control device 7 according to the embodiment. As illustrated in FIG. 3, the control device 7 includes a communication unit 8, the storage 9, and the controller 10.

The control device 7 is connected to the above-mentioned temperature sensor 113 and the above-mentioned concentration sensor 114.

Note that instead of or in addition to the functional units illustrated in FIG. 3, the control device 7 may include various functional units included in a well-known computer, such as functional units of various input devices and various sound output devices.

The communication unit 8 is realized by, for example, a Network Interface Card (NIC), and the like. The communication unit 8 is connected to a management device 200 via a network N in a wired or wireless manner so as to serve as a communication interface that manages communication of information with the above-mentioned management device 200.

The communication unit 8 receives, from the management device 200, various kinds of information related to the plurality of wafers W that is housed in the FOUP F. For example, the communication unit 8 receives, form the management device 200, information related to the number of the wafers W housed in the FOUP F and information related to a type of a device formed on each of the wafers W. Next, the communication unit 8 outputs the above-mentioned received information to the controller 10. Note that the management device 200 may acquire the information related to the number of the wafers W housed in the FOUP F from a wafer number measuring device 11 included in the substrate processing system 1. For example, the wafer number measuring device 11 is arranged near the carrier placing pedestal 24 to be capable of optically detecting the wafers W housed in the FOUP F.

Note that in the present disclosure, the information related to a type of a device formed on each of the wafer W may include film thicknesses and the lamination numbers of silicon nitride films and silicon oxide films that are laminated on the wafer W, for example.

For example, the storage 9 may be realized by a semiconductor memory element such as a RAM and a flash memory and/or a storage device such as a hard disk and an optical disc. The storage 9 includes a concentration adjusting information storage 9*a* and a temperature adjusting information storage 9*b*. Furthermore, the storage 9 stores therein information to be used in processing in The concentration adjusting information storage 9*a* stores therein concentration adjusting information in which brought-in amounts and concentration adjustment values are associated with the numbers of the wafers W. The brought-in amount indicates an amount of rinse liquid that is brought in the processing tank 61 along with a plurality of substrates. The concentration adjustment value indicates a value to be used in a concentration controlling process executed by a concentration controlling unit 10*b* to be mentioned later. Relation between the number of the wafers W and a brought-in amount will be explained with reference to FIG. 4.

Figure 4:
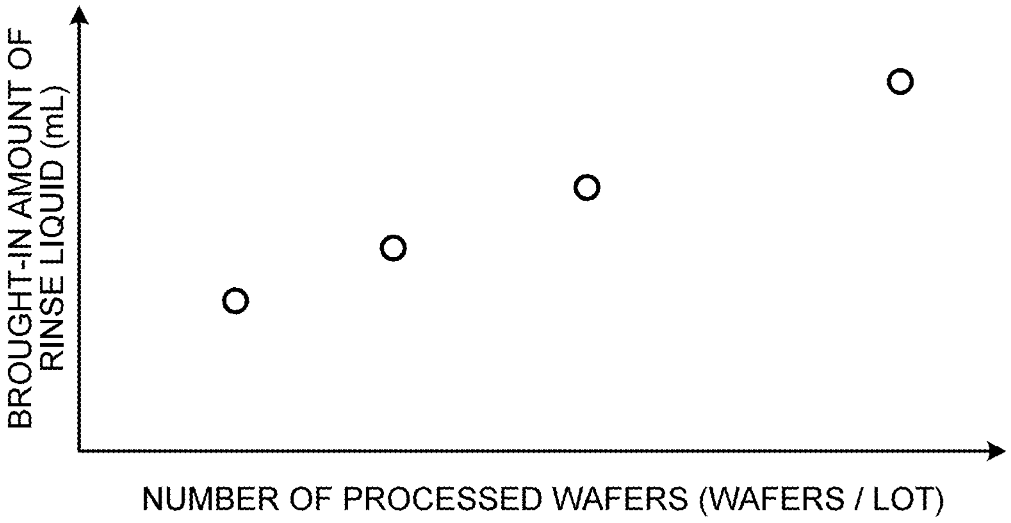
FIG. 4 is a diagram illustrating one example of relation between the number of wafers and a brought-in amount of rinse liquid.

FIG. 4 is a diagram illustrating one example of relation between the number of the wafers W and a brought-in amount of rinse liquid. In a graph illustrated in FIG. 4, a horizontal axis indicates the number of the wafers W, and a vertical axis indicates a brought-in amount of rinse liquid. As illustrated in FIG. 4, there presents correlation between the number of the wafers W and a brought-in amount, and the brought-in amount of rinse liquid increases as the number of the wafers W increases.

The concentration adjusting information illustrated in FIG. 4 may be obtained by executing an operation, a plurality of times while changing the number of the wafers W, for measuring a difference between an amount of rinse liquid in the processing tank 62 before dipping therein the wafers W and an amount of the rinse liquid in the processing tank 62 after taking the wafers W out of the processing tank 62, for example. Not limited thereto, a weight of the single wafer W may be measured before dipping the single wafer W in the processing tank 62 and after taking the single wafer W out of the processing tank 62, a brought-in amount per the single wafer W may be calculated on the basis of a difference therebetween, and the calculation result may be multiplied by an integer number so as to obtain a brought-in amount in a case of the wafer number. Concentration adjusting information illustrated in FIG. 4 is one example of brought-in amount information in which the numbers of substrates and respective brought-in amounts are preliminarily associated with each other.

A concentration adjustment value is an offset value (wt %) from a reference value of a phosphoric acid concentration, for example. The above-mentioned concentration adjustment value may be calculated from a brought-in amount. Specifically, a concentration adjustment value is a difference value between a phosphoric acid concentration (namely, initial concentration) of phosphoric acid processing liquid in the inner tank 111 before rinse liquid is brought in the processing tank 61, and a phosphoric acid concentration of phosphoric acid processing liquid in the inner tank 111 after rinse liquid is brought in the processing tank 61.

The temperature adjusting information storage 9*b* stores therein temperature adjusting information in which the numbers of the wafers W and respective temperature adjustment values are associated with each other. The temperature adjustment value indicates a value to be used in a temperature controlling process to be mentioned later by a temperature controlling unit 10*c*. Relation between the number of the wafers W and a temperature adjustment value will be explained with reference to FIG. 5.

Figure 5:
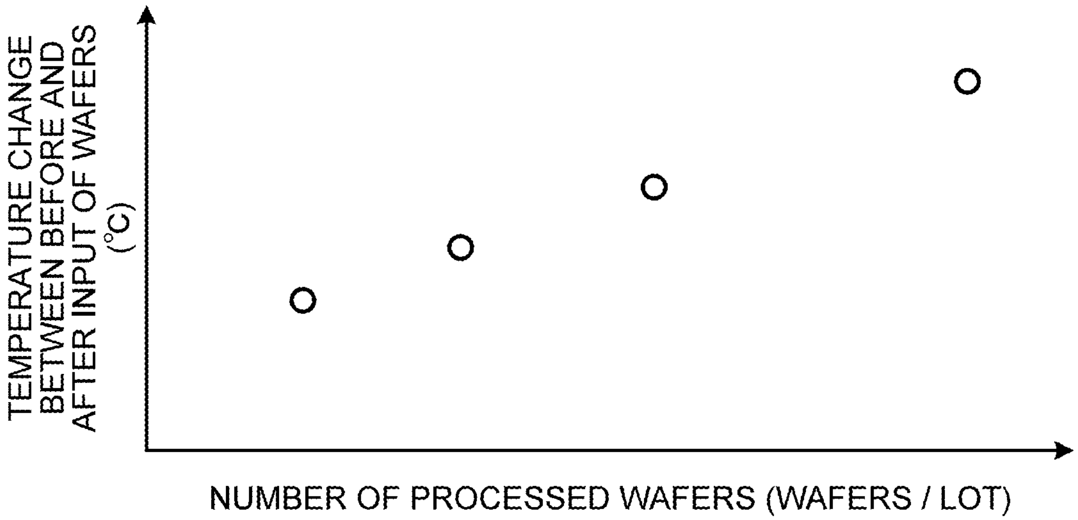
FIG. 5 is a diagram illustrating one example of relation between the number of wafers and a temperature change between before and after an input of the wafers.

FIG. 5 is a diagram illustrating relation between the number of the wafers W and a temperature change between before and after an input of the wafers W. In a graph illustrated in FIG. 5, a horizontal axis indicates the number of the wafers W, and a vertical axis indicates a temperature change between before and after an input of the wafers W. The temperature change between before and after an input of the wafers W is a difference value between a temperature of phosphoric acid processing liquid in the inner tank 111 before the wafers W are dipped in the processing tank 61, and a temperature of phosphoric acid processing liquid in the inner tank 111 after the rinse-processed wafers W are dipped in the processing tank 61. As illustrated in FIG. 5, there presents correlation between the number of the wafers W and a temperature change between before and after an input of the wafers W, and a temperature change between before and after an input of the wafers W increases as the number of the wafers W increases.

A temperature adjustment value in the temperature adjusting information is an offset value (° C.) from a reference value of a phosphoric acid temperature, for example, and specifically, is the above-mentioned difference value in the temperature of phosphoric acid processing liquid between before and after an input of the wafers W. The temperature adjusting information may be obtained by executing an operation, a plurality of times while changing the number of the wafers W, for measuring a difference between a temperature of phosphoric acid processing liquid in the processing tank 61 before dipping therein the wafers W and a temperature of the phosphoric acid processing liquid in the processing tank 61 after dipping therein the wafers W, for example.

For example, a CPU, a Micro Processing Unit (MPU), a Graphics Processing Unit (GPU), or the like executes a program stored in the storage 9 while using a RAM as a working region so as to realize the controller 10.

Moreover, the controller 10 may be realized by an integrated circuit such as an Application Specific Integrated Circuit (ASIC) and a Field Programmable Gate Array (FPGA).

The controller 10 includes an acquisition unit 10*a*, the concentration controlling unit 10*b*, and the temperature controlling unit 10*c* so as to realize/execute functions and effects of controlling processes to be mentioned later. Note that an inner configuration of the controller 10 is not limited to one illustrated in FIG. 3, and further may be another one as long as the configuration executes the controlling processes to be mentioned later.

The acquisition unit 10a acquires, from the management device 200 via the communication unit 8, information related to the number of the wafers W included in a lot to be processed. For example, on the basis of identification information of the FOUP F (see FIG. 1) that accommodates therein a lot to be processed, the acquisition unit 10a acquires, from the management device 200, various kinds of information including information on the number of the wafers W housed in the FOUP F. The above-mentioned information acquired from the management device 200 is one example of management information in which identification information of the FOUPs F and the numbers of substrates housed in the respective FOUPs F are associated with each other.

The concentration controlling unit 10b acquires a brought-in amount that is an amount of rinse liquid brought in the processing tank 61 along with the plurality of wafers W on the basis of the number of the wafers W acquired by the acquisition unit 10a, and further adjusts a concentration of phosphoric acid processing liquid on the basis of the above-mentioned brought-in amount. Specifically, the concentration controlling unit 10b executes a process for preliminarily setting a phosphoric acid concentration to be high in consideration of reduction in a phosphoric acid concentration due to bringing-in of rinse liquid. In this case, the concentration controlling unit 10b sets a target concentration of phosphoric acid processing liquid in accordance with the number of the wafers W to be collectively dipped in the processing tank 61 so as to be capable of reducing a variation in an etching amount between lots. Details of the concentration controlling process of phosphoric acid processing liquid in the concentration controlling unit 10b will be mentioned later.

The temperature controlling unit 10c acquires a temperature adjustment value according to the number of the wafers W that is acquired by the acquisition unit 10a, and further controls the heater 122 on the basis of the above-mentioned temperature adjustment value so as to adjust a temperature of phosphoric acid processing liquid. Specifically, the temperature controlling unit 10c executes a process for preliminarily setting a phosphoric acid temperature to be high in consideration of reduction in a phosphoric acid temperature due to dipping of the rinsing-processed wafers W in the processing tank 61. In this case, the temperature controlling unit 10c sets a target temperature of phosphoric acid processing liquid in accordance with the number of the wafers W to be collectively dipped in the processing tank 61 so as to be capable of reducing a variation in an etching amount between lots. Details of the temperature controlling process of phosphoric acid processing liquid in the temperature controlling unit 10c will be mentioned later.

<Procedure for Controlling Process>

Figure 6:
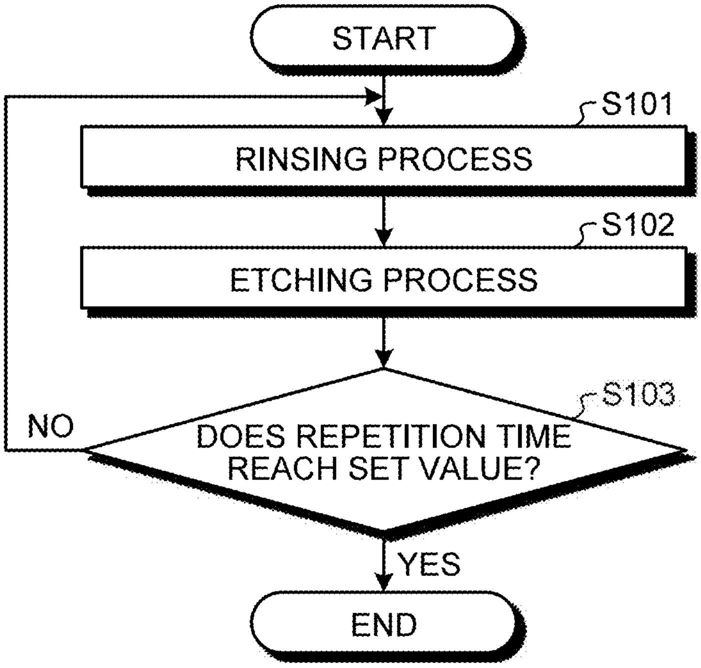
FIG. 6 is a flowchart illustrating one example of a procedure for cycle etching to be executed by the substrate processing system according to the embodiment.

Next, a procedure for cycle etching according to the embodiment will be explained with reference to FIG. 6. FIG. 6 is a flowchart illustrating one example of a procedure for cycle etching to be executed by the substrate processing system 1 according to the embodiment.

The controller 10 carries a lot in the processing tank 62, and further dips the wafers W in rinse liquid so as to execute thereon a rinsing process (Step S101). Rinse liquid including hydrofluoric acid may be used in the first rinsing process so as to execute the rinsing process.

Next, the controller 10 carries a lot in the processing tank 61, and further dips the wafers W in phosphoric acid processing liquid so as to execute an etching process (Step S102). The controller 10 executes the process at short time intervals, which is equal to or less than 10 minutes, for example.

Next, the controller 10 determines whether or not the number (repetition time) of times of each of rinsing processes and etching processes reaches a predetermined set value (Step S103). In a case where the repetition time reaches the set value, the controller 10 ends the processing of the flowchart. On the other hand, in a case where the repetition time does not reach up to the set value, the controller 10 returns the processing to Step S101.

As described above, the substrate processing system 1 according to the embodiment executes cycle etching in which a series of processing procedures for repeatedly performing an etching process subsequent to a rinsing process is executed at a plurality of times. By employing such cycle etching, it is possible to equalize an etching rate between the top and the bottom in a lamination direction of a high lamination film.

Note that the substrate processing system 1 does not have to execute cycle etching. It is sufficient that the substrate processing system 1 executes, at least once, a series of processing procedures for performing an etching process subsequent to a rinsing process.

Figure 7:
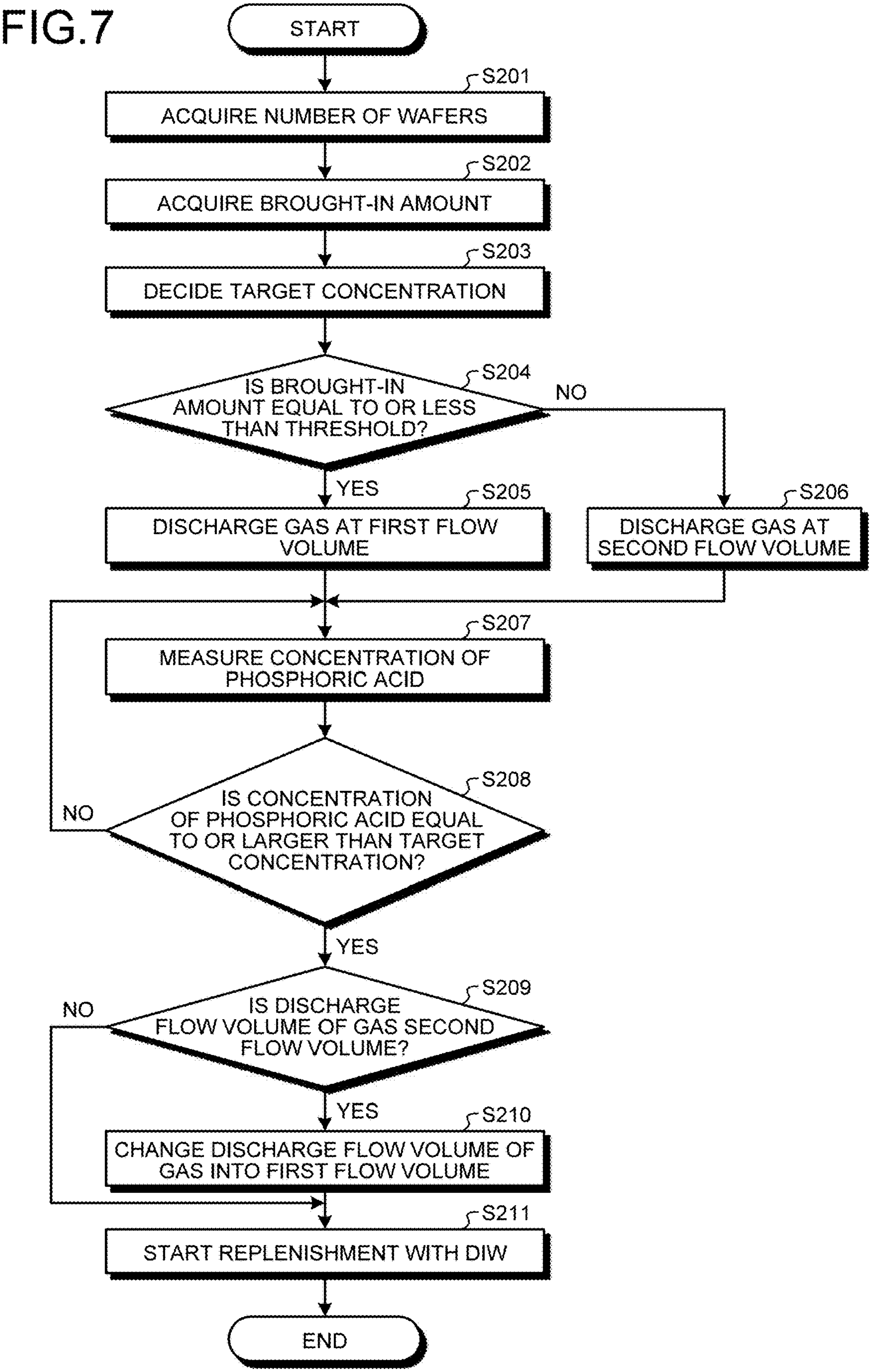
FIG. 7 is a flowchart illustrating one example of a procedure for a concentration controlling process to be executed by the substrate processing system according to the embodiment.

Next, a procedure for the concentration controlling process according to the embodiment will be explained with reference to FIG. 7. FIG. 7 is a flowchart illustrating one example of a procedure for the concentration controlling process to be executed by the substrate processing system 1 according to the embodiment. A process illustrated in FIG. 7 is executed before the wafers W are carried in the processing tank 61. Specifically, the process starts in a case where the wafers W are dipped in the processing tank 62 and then a rinsing process starts.

On the basis of management information acquired from the management device 200, the acquisition unit 10a acquires the number of the wafers W included in a lot to be carried in the processing tank 61 (Step S201). In other words, the acquisition unit 10a acquires, from management information, the number of the wafers W associated with identification information of the FOUR F that houses therein the wafers W constituting a lot to be carried in the processing tank 61.

Next, the concentration controlling unit 10b acquires a brought-in amount and a concentration adjustment value that are corresponding to the number of the wafers W acquired by the acquisition unit 10a in Step S201 with the use of concentration adjusting information that is stored in the concentration adjusting information storage 9a (Step S202).

Next, the concentration controlling unit 10b decides a target concentration on the basis of the concentration adjustment value acquired in Step S202 (Step S203). Specifically, the concentration controlling unit 10b decides, as a target concentration, a concentration obtained by adding a concentration adjustment value (offset value) to a predetermined processing concentration.

Next, the concentration controlling unit 10b determines whether or not the brought-in amount acquired in Step S202 is equal to or less than a predetermined threshold (Step S204). In the above-mentioned process, in a case where determining that a brought-in amount is equal to or less than the threshold (Step S204: Yes), the concentration controlling unit 10b controls the gas discharging unit 140 so as to discharge gas at a first flow volume (Step S205). On the other hand, in Step S204, in a case where a brought-in amount exceeds the threshold (Step S204: No), the concentration controlling unit 10_b_ controls the gas discharging unit 140 so as to discharge gas at a second flow volume that is larger than the first flow volume (Step S206). The second flow volume is a flow volume that enables a concentration of phosphoric acid processing liquid to reach a target concentration by the time of completion of the rinsing process.

Specific examples of processes of Steps S204 to S206 will be explained. For example, in a case where the gas discharging unit 140 discharges gas at the first flow volume, assume that water evaporates at 10 mL/min. In a case where a time interval (namely, time interval from start of processing flow illustrated in FIG. 7 until completion of rinsing process) of a rinsing process is 2 min, water of 200 mL can be evaporated at the first flow volume, and thus a threshold is set to 200 mL.

In Step S204, the concentration controlling unit 10_b_ determines whether or not a brought-in amount is equal to or less than 200 mL. In a case where a brought-in amount is equal to or less than 200 mL, if gas is discharged at the first flow volume, water having an amount corresponding to a brought-in amount can be evaporated, and thus in Step S205, the concentration controlling unit 10_b_ controls the gas discharging unit 140 so as to discharge gas at the first flow volume. On the contrary, in a case where a brought-in amount is larger than 200 ml, it is impossible to evaporate water having an amount corresponding to the brought-in amount at the first flow volume, and thus the concentration controlling unit 10_b_ controls the gas discharging unit 140 so as to discharge gas at a second flow volume that is larger than the first flow volume.

According to the above-mentioned processing, it is possible to adjust, by the time of completion of a rinsing process, a concentration of phosphoric acid processing liquid in the processing tank 61 to a concentration taking into account of a brought-in amount. Thus, it is possible to prevent reduction in throughput in a rinsing process and an etching process.

Next, the concentration controlling unit 10_b_ causes the concentration sensor 114 to measure a concentration of phosphoric acid processing liquid (Step S207).

Next, the concentration controlling unit 10_b_ determines whether or not the concentration of phosphoric acid processing liquid acquired in Step S207 is equal to or larger than a target concentration decided in Step S203 (Step S208). In a case where the concentration of phosphoric acid processing liquid is equal to or larger than the target concentration, the concentration controlling unit 10_b_ shifts the processing to Step S209. On the other hand, in a case where the concentration of phosphoric acid processing liquid is less than the target concentration, the concentration controlling unit 10_b_ returns the processing to Step S207.

Next, the concentration controlling unit 10_b_ determines whether or not a discharge flow volume of gas by the gas discharging unit 140 is a second flow volume (Step S209). In a case where a discharge flow volume of gas is the second flow volume (Step S209: Yes), the concentration controlling unit 10_b_ controls the gas discharging unit 140 so as to change a discharge flow volume of gas into the first flow volume (Step S210). On the other hand, in a case where a discharge flow volume of gas is not the second flow volume (Step S209: No), the concentration controlling unit 10_b_ shifts the processing to Step S211.

Next, the concentration controlling unit 10_b_ controls the DIW supply unit 130 so as to start replenishment with DIW (Step S211). According to the above-mentioned processing, it is possible to keep a phosphoric acid concentration constant after a concentration of phosphoric acid processing liquid reaches a target concentration.

As described above, in a case where a brought-in amount exceeds a threshold, the concentration controlling unit 10_b_ discharges gas at a second flow volume during a time interval in which a phosphoric acid concentration measured by the concentration sensor 114 is less than a target concentration. In a case where a phosphoric acid concentration measured by the concentration sensor 114 becomes equal to or larger than the target concentration, the concentration controlling unit 10_b_ changes a discharge flow volume of the gas from the second flow volume into a first flow volume.

Moreover, during a time interval in which a phosphoric acid concentration measured by the concentration sensor 114 is less than the target concentration, the concentration controlling unit 10_b_ causes the DIW supply unit 130 (one example of water replenishment unit) to stop replenishment of the processing tank 61 with water. In a case where a phosphoric acid concentration measured by the concentration sensor 114 becomes equal to or larger than the target concentration, the concentration controlling unit 10_b_ control the DIW supply unit 130 so as to replenish the processing tank 61 with water.

Figure 8:
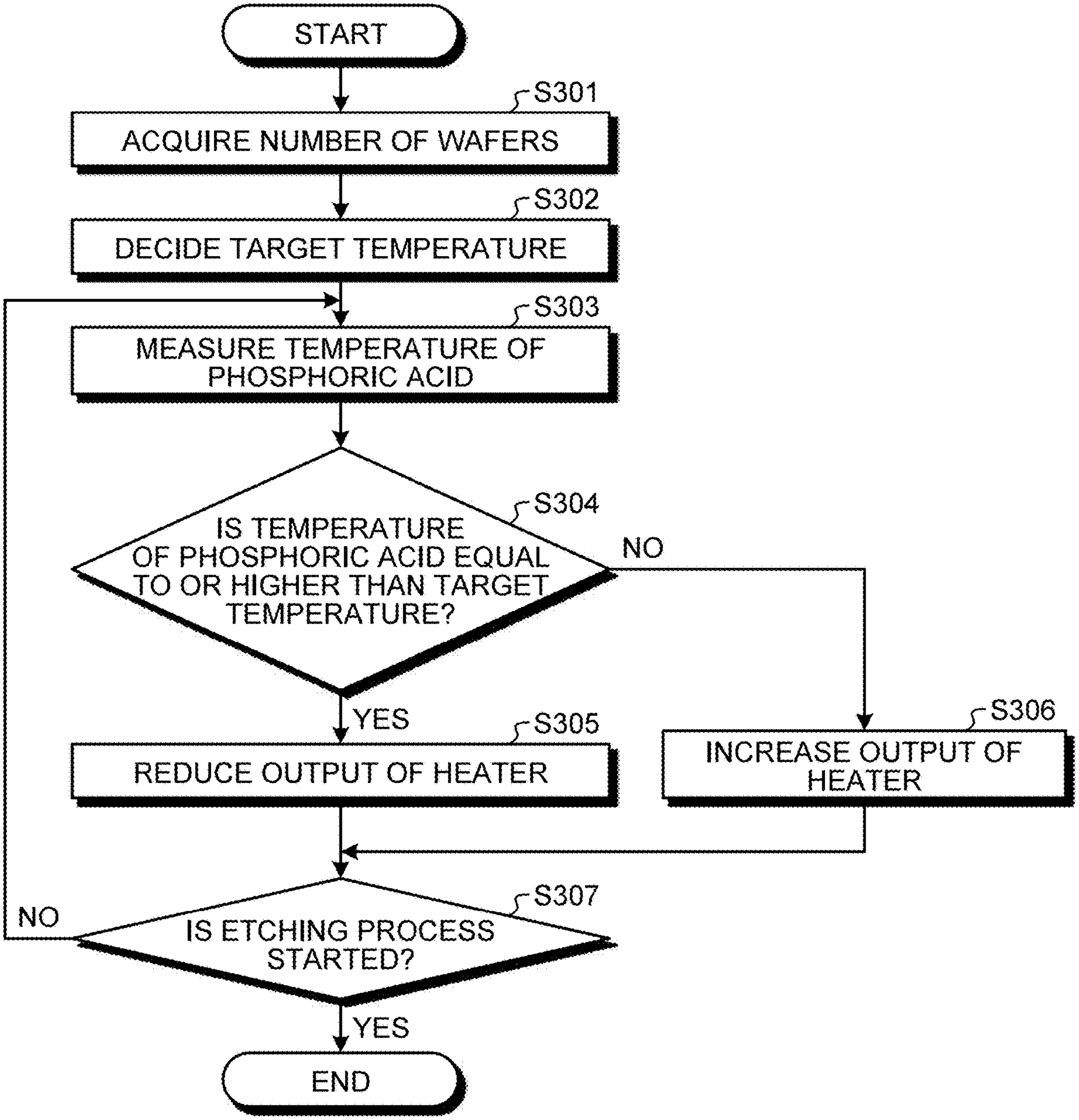
FIG. 8 is a flowchart illustrating one example of a procedure for a temperature controlling process to be executed by the substrate processing system according to the embodiment.

Next, a procedure for the temperature controlling process according to the embodiment will be explained with reference to FIG. 8. FIG. 8 is a flowchart illustrating one example of a procedure for the temperature controlling process to be executed by the substrate processing system 1 according to the embodiment. The process illustrated in FIG. 7 is executed before the wafers W are carried in the processing tank 61. Specifically, the process starts in a case where the wafers W are dipped in the processing tank 62 and then a rinsing process starts.

The acquisition unit 10_a_ acquires the number of the wafers W included in a lot to be carried in the processing tank 61 on the basis of management information that is acquired from the management device 200 (Step S301). In other words, the acquisition unit 10_a_ acquires, from management information, the number of the wafers W associated with identification information of the FOUP F that houses therein the wafers W constituting the lot to be carried in the processing tank 61.

Next, the temperature controlling unit 10_c_ acquires a temperature adjustment value corresponding to the number of the wafers W acquired by the acquisition unit 10_a_ in Step S301 with the use of temperature adjusting information that is stored in the temperature adjusting information storage 9_b_. Next, the temperature controlling unit 10_c_ decides a target temperature on the basis of the acquired temperature adjustment value (Step S302). Specifically, the temperature controlling unit 10_c_ decides, as a target temperature, a temperature obtained by adding a temperature adjustment value (offset value) to a predetermined processing temperature.

Next, the temperature controlling unit 10_c_ causes the temperature sensor 113 to measure a temperature of phosphoric acid processing liquid (Step S303).

Next, the temperature controlling unit 10_c_ determines whether or not a temperature of phosphoric acid processing liquid acquired in Step S303 is equal to or higher than the target temperature decided in Step S302 (Step S304). In a case where a temperature of phosphoric acid processing liquid is equal to or higher than the target temperature (Step S304: Yes), the temperature controlling unit 10_c_ controls the heater 122 so as to reduce an output thereof (Step S305). On the other hand, in a case where a temperature of phosphoric acid processing liquid is lower than the target temperature (Step S304: No), the temperature controlling unit 10*c* controls the heater 122 to increase an output thereof (Step S306).

Next, the temperature controlling unit 10*c* determines whether or not an etching process is started (Step S307). In a case where an etching process is started (Step S307: Yes), the temperature controlling unit 10*c* ends the processing of the present flowchart. On the other hand, in a case where an etching process is not started (Step S307: No), the temperature controlling unit 10*c* returns the processing to Step S303. In other words, the temperature controlling unit 10*c* continues a process for keeping a temperature of phosphoric acid processing liquid at a target temperature during a time interval until an etching process is started.

Modification

In the above-mentioned embodiment, a concentration controlling process executed by the concentration controlling unit 10*b* and a temperature controlling process executed by the temperature controlling unit 10*c* are separately explained; however, the concentration controlling process and the temperature controlling process may be integrally executed. Additionally, one of the processes alone may be executed.

In the above-mentioned embodiment, an example is explained in which the concentration controlling unit 10*b* completes a concentration controlling process by the time of completion of a rinsing process with respect to the wafers W; however, the timing for executing the above-mentioned concentration controlling process is not limited to the aforementioned. For example, a concentration controlling process may be executed during an etching process; or a waiting time interval after a rinsing process and/or an etching process may be set so as to execute a concentration adjusting process during the waiting time interval. Furthermore, the same is applied to a timing for executing the temperature controlling process.

In the above-mentioned embodiment, an example is explained as a method for adjusting a concentration of phosphoric acid processing liquid, in which a discharge flow volume of gas by the gas discharging unit 140 and a supply amount of DIW by the DIW supply unit 130 are adjusted; however, a method for adjusting a concentration of phosphoric acid processing liquid is not limited to the above-mentioned method. For example, the concentration controlling unit 10*b* may additionally supply phosphoric acid processing liquid having a high concentration to the processing tank 61 so as to adjust a concentration of phosphoric acid processing liquid.

As described above, a substrate processing apparatus (for one example, substrate processing system 1) according to the embodiment includes a rinsing tank (for one example, processing tank 62), a processing tank (for one example, processing tank 61), an acquisition unit (for one example, acquisition unit 10*a*), a concentration adjusting unit (for one example, gas discharging unit 140), and a concentration controlling unit (for one example, concentration controlling unit 10*b*). The rinsing tank is a tank retaining therein rinse liquid including water, and in which a plurality of substrates (for one example, wafers W) each including inorganic films is dipped in the retained rinse liquid (for one example, processing liquid dedicated to rinsing process) to execute a rinsing process on the plurality of substrates. The processing tank is a tank retaining therein phosphoric acid processing liquid (for one example, phosphoric acid processing liquid), and in which the plurality of substrates subsequent to the rinsing process is dipped in the retained phosphoric acid processing liquid to execute an etching process on the plurality of substrates. The acquisition unit acquires the number of the substrates to be collectively dipped in the processing tank. The concentration adjusting unit adjusts a concentration of the phosphoric acid processing liquid retained in the processing tank. The concentration controlling unit is configured to: based on the number of the substrates acquired by the acquisition unit, acquire a brought-in amount that is an amount of the rinse liquid brought in the processing tank along with the plurality of substrates; and control the concentration adjusting unit based on the brought-in amount to adjust a concentration of the phosphoric acid processing liquid.

On the basis of the number of the substrates to be collectively dipped in the processing tank that retains therein phosphoric acid processing liquid, the substrate processing apparatus according to the embodiment acquires a brought-in amount that is an amount of rinse liquid to be brought in the processing tank along with the plurality of substrates. Next, the substrate processing apparatus according to the embodiment adjusts a concentration of phosphoric acid processing liquid on the basis of the brought-in amount.

According to such a configuration, even in a case where an etching process is executed on substrates subsequent to a rinsing process, a concentration adjusting process is executed so as to correspond to a factor (brought-in amount of rinse liquid that changes depending on number of substrates to be collectively dipped in processing tank) that causes a change in a concentration of phosphoric acid processing liquid. Thus, it is possible to perform an etching process on substrates subsequent to a rinsing process at an appropriate concentration. Moreover, even in a case where the numbers of substrates on which an etching process is collectively performed are different, it is possible to reduce a variation in a phosphoric acid concentration.

Thus, in accordance with the substrate processing apparatus according to the embodiment, it is possible to reduce a variation in an etching amount in a technology for collectively performing etching on a plurality of substrates by using phosphoric acid aqueous solution.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

The invention claimed is:

1. A substrate processing apparatus comprising:

a rinsing tank that is a tank retaining therein rinse liquid including water, and in which a plurality of substrates each including inorganic films is dipped in the retained rinse liquid to execute a rinsing process on the plurality of substrates;

a processing tank that is a tank retaining therein phosphoric acid processing liquid, and in which the plurality of substrates subsequent to the rinsing process is dipped in the retained phosphoric acid processing liquid to execute an etching process on the plurality of substrates;

an acquisition unit that acquires a number of the substrates to be collectively dipped in the processing tank;

a concentration adjusting unit that adjusts a concentration of the phosphoric acid processing liquid retained in the processing tank; and a concentration controlling unit configured to:

based on the number of the substrates acquired by the acquisition unit, acquire a brought-in amount that is an amount of the rinse liquid brought in the processing tank along with the plurality of substrates; and control the concentration adjusting unit based on the brought-in amount to adjust a concentration of the phosphoric acid processing liquid.

2. The substrate processing apparatus according to claim 1, wherein the concentration controlling unit is further configured to:

before the etching process, cause the concentration adjusting unit to start concentration adjustment of the phosphoric acid processing liquid.

3. The substrate processing apparatus according to claim 1, wherein the concentration controlling unit is further configured to:

during the rinsing process, cause the concentration adjusting unit to complete concentration adjustment of the phosphoric acid processing liquid.

4. The substrate processing apparatus according to claim 1, wherein the substrate processing apparatus executes, at least once, a series of processing procedures for executing the etching process subsequent to the rinsing process.

5. The substrate processing apparatus according to claim 1 further comprising:

a storage that stores therein brought-in amount information in which numbers of the substrates and respective brought-in amounts are preliminarily associated with each other, wherein the concentration controlling unit is further configured to:

by using the brought-in amount information, acquire the brought-in amount corresponding to the number of the substrates acquired by the acquisition unit.

6. The substrate processing apparatus according to claim 1, wherein the acquisition unit acquires the number of the substrates to be collectively dipped in the processing tank based on management information in which identification information for identifying Front Opening Unified Pods (FOUPs) each capable of housing therein a plurality of substrates and numbers of the substrates housed in the respective FOUPs are associated with each other.

7. The substrate processing apparatus according to claim 1, wherein the inorganic film includes a nitride film.

8. The substrate processing apparatus according to claim 1, wherein the concentration adjusting unit includes:

a gas discharging unit that discharges gas into the processing tank, and the concentration controlling unit is further configured to:

cause the gas discharging unit to change a discharge flow volume of the gas to adjust a concentration of the phosphoric acid processing liquid.

9. The substrate processing apparatus according to claim 8, wherein the concentration adjusting unit is further configured to:

in a case where the brought-in amount is equal to or less than a threshold, discharge the gas at a first flow volume; and in a case where the brought-in amount exceeds the threshold, discharge the gas at a second flow volume that is larger than the first flow volume.

10. The substrate processing apparatus according to claim 9 further comprising:

a measurement unit that measures a concentration of the phosphoric acid processing liquid retained in the processing tank; and a storage that stores therein concentration adjusting information in which numbers of the substrates and respective concentration adjustment values are preliminarily associated with each other, wherein the concentration controlling unit is further configured to:

by using the concentration adjusting information, acquire the concentration adjustment value corresponding to the number of the substrates acquired by the acquisition unit;

set a target concentration based on the acquired concentration adjustment value;

in a case where the brought-in amount exceeds the threshold, discharge the gas at the second flow volume during a time interval in which a concentration of the phosphoric acid processing liquid measured by the measurement unit is less than the target concentration; and in a case where the concentration of the phosphoric acid processing liquid measured by the measurement unit is equal to or larger than the target concentration, change a discharge flow volume of the gas from the second flow volume into the first flow volume.

11. The substrate processing apparatus according to claim 10 further comprising:

a water replenishment unit that replenishes the processing tank with water, wherein the concentration controlling unit is further configured to:

during a time interval in which a concentration of the phosphoric acid processing liquid measured by the measurement unit is less than the target concentration, cause the water replenishment unit not to replenish the processing tank with water; and in a case where a concentration of the phosphoric acid processing liquid measured by the measurement unit is equal to or larger than the target concentration, control the water replenishment unit to replenish the processing tank with water.

12. The substrate processing apparatus according to claim 1 further comprising:

a temperature regulating unit that adjusts a temperature of the phosphoric acid processing liquid retained in the processing tank; and a temperature controlling unit configured to:

acquire a temperature adjustment value according to the number of the substrates acquired by the acquisition unit; and based on the temperature adjustment value, control the temperature regulating unit to adjust a temperature of the phosphoric acid processing liquid.

13. The substrate processing apparatus according to claim 12 further comprising:

a storage that stores therein temperature adjusting information in which numbers of the substrates and temperature adjustment values are preliminarily associated with each other, wherein the temperature controlling unit is further configured to:

by using the temperature adjusting information, acquire a temperature adjustment value corresponding to the number of the substrates acquired by the acquisition unit.

14. The substrate processing apparatus according to claim 12, wherein the temperature controlling unit is further configured to:

control the temperature regulating unit to adjust a temperature of the phosphoric acid processing liquid to a temperature obtained by adding the temperature adjustment value to a predetermined processing temperature.

15. A substrate processing method comprising:

dipping a plurality of substrates each including inorganic films in a rinsing tank that retains rinse liquid including water to execute a rinsing process on the plurality of substrates;

dipping the plurality of substrates subsequent to the rinsing process in a processing tank that retains phosphoric acid processing liquid to execute an etching process on the plurality of substrates;

acquiring a number of the substrates to be collectively dipped in the processing tank;

based on the number of the substrates acquired in the acquiring, acquiring a brought-in amount that is an amount of the rinse liquid to be brought in the processing tank along with the plurality of substrates; and based on the brought-in amount, adjusting a concentration of the phosphoric acid processing liquid retained in the processing tank.

* * * * *